United States Patent
Ohba et al.

(10) Patent No.: US 9,433,122 B2
(45) Date of Patent: Aug. 30, 2016

(54) AIR CONDITIONING SYSTEM

(75) Inventors: Yuji Ohba, Kawasaki (JP); Junichi Ishimine, Kawasaki (JP); Tomoaki Haneda, Kawasaki (JP); Jun Takeda, Kawasaki (JP); Masamichi Iwasaki, Tokyo (JP); Shinji Mizumura, Tokyo (JP)

(73) Assignees: FUJITSU LIMITED, Kawasaki (JP); FUJI ELECTRIC CO., LTD., Kawasaki (JP)

( * ) Notice: Subject to any disclaimer, the term of this patent is extended or adjusted under 35 U.S.C. 154(b) by 1030 days.

(21) Appl. No.: 13/317,510

(22) Filed: Oct. 20, 2011

(65) Prior Publication Data

US 2012/0097360 A1 Apr. 26, 2012

(30) Foreign Application Priority Data

Oct. 25, 2010 (JP) ................................. 2010-238729

(51) Int. Cl.
G05D 23/00 (2006.01)
B60H 1/00 (2006.01)
H05K 7/20 (2006.01)

(52) U.S. Cl.
CPC ............ *H05K 7/20* (2013.01); *H05K 7/20745* (2013.01); *H01L 2924/0002* (2013.01)

(58) Field of Classification Search
CPC ............... H05K 7/20; H05K 7/20745; H05K 7/20136; H05K 7/20209; H05K 7/202; H01L 2924/0002
USPC ........... 454/184; 361/691, 696; 62/129, 130; 165/293, 295, 11.1, 80.3
See application file for complete search history.

(56) References Cited

U.S. PATENT DOCUMENTS 4,667,480 A * 5/1987 Bessler ........................... 62/180
4,795,089 A 1/1989 Tezuka et al.
(Continued)

FOREIGN PATENT DOCUMENTS

CN 87 1 03719 12/1987
CN 1135335 1/2004
(Continued)

OTHER PUBLICATIONS

Japanese Office Action mailed Jan. 28, 2014 in corresponding Japanese Application No. 2010-238729.
(Continued)

*Primary Examiner* — Frantz Jules
*Assistant Examiner* — Claire Rojohn, III
(74) *Attorney, Agent, or Firm* — Staas & Halsey LLP

(57) ABSTRACT

An air conditioner sucks air exhausted from an information processor, and cools down the sucked air. The air conditioner exhausts the cooled air. The air conditioner acquires a cooling state, determines whether a cooling capacity exceeds an upper limit value, and reduces the volume of exhaust air when it is determined that the cooling capacity exceeds the upper limit value. For example, the air conditioner calculates a thermal load as the cooling state by using the volume of exhaust air, a difference between the temperature of exhaust air and the temperature of suction air, and determines that the cooling capacity exceeds the upper limit value when the calculated thermal load exceeds a given threshold. The air conditioner measures the temperature of exhaust air, and determines that the cooling capacity exceeds the upper limit value when the measured temperature exceeds a set value.

6 Claims, 9 Drawing Sheets

(56) References Cited

U.S. PATENT DOCUMENTS

| | | | |
|---|---|---|---|
| 5,040,377 | A | 8/1991 | Braun et al. |
| 6,539,736 | B1 * | 4/2003 | Isazawa .................. F24F 5/00 62/132 |
| 6,896,612 | B1 * | 5/2005 | Novotny ...................... 454/184 |
| 7,878,007 | B2 * | 2/2011 | Campbell et al. ........... 165/11.1 |
| 2004/0099747 | A1 * | 5/2004 | Johnson ............. H05K 7/20836 236/49.3 |
| 2006/0002084 | A1 * | 1/2006 | Wei ................... H05K 7/20745 361/695 |
| 2006/0161307 | A1 | 7/2006 | Patel et al. |
| 2007/0125107 | A1 | 6/2007 | Beam |
| 2008/0041076 | A1 * | 2/2008 | Tutunoglu et al. ............. 62/181 |
| 2008/0055846 | A1 * | 3/2008 | Clidaras ................... G06F 1/20 361/679.41 |
| 2009/0168345 | A1 * | 7/2009 | Martini ................ F24F 11/0001 361/691 |
| 2010/0027216 | A1 | 2/2010 | Matsushima et al. |
| 2010/0252233 | A1 * | 10/2010 | Absalom ............ H05K 7/20745 165/57 |

FOREIGN PATENT DOCUMENTS

| | | |
|---|---|---|
| CN | 1804490 | 7/2006 |
| EP | 2 169 328 A2 | 3/2010 |
| JP | 2-31911 | 2/1990 |
| JP | 09236332 A * | 9/1997 |
| JP | 10-19337 | 1/1998 |
| JP | 10038358 A * | 2/1998 |
| JP | 2002-235959 | 8/2002 |
| JP | 2003-166729 | 6/2003 |
| JP | 2006-114669 | 4/2006 |
| JP | 2006-526205 | 11/2006 |
| JP | 2008-502082 | 1/2008 |
| JP | 2008-105659 | 5/2008 |
| JP | 2009-174851 | 8/2009 |
| JP | 2009-257718 | 11/2009 |
| JP | 2009-257721 | 11/2009 |
| JP | 2009-264599 | 11/2009 |
| JP | 2010-85011 | 4/2010 |
| JP | 2010-96432 | 4/2010 |
| JP | 2010-223487 | 10/2010 |
| WO | 2004/083743 A2 | 9/2004 |
| WO | 2005/122664 A1 | 12/2005 |
| WO | 2007/019304 | 2/2007 |

OTHER PUBLICATIONS

Australian Office Action issued Oct. 19, 2012 in corresponding Australian Patent Application No. 2011239321.
Extended European Search Report mailed Jul. 4, 2014 for corresponding European Patent Application No. 11186567.1.
Japanese Office Action mailed May 27, 2014 in corresponding Japanese Patent Application No. 2010-238729.
Chinese Office Action mailed Dec. 17, 2013 in corresponding Chinese Patent Application No. 201110328951.8.
Chinese Office Action for corresponding Chinese Patent Application No. 201110328951.8, issued Sep. 22, 2014, 22 pages.
Japanese Office Action mailed Jun. 2, 2015 in corresponding Japanese Patent Application No. 2014-149202.

* cited by examiner

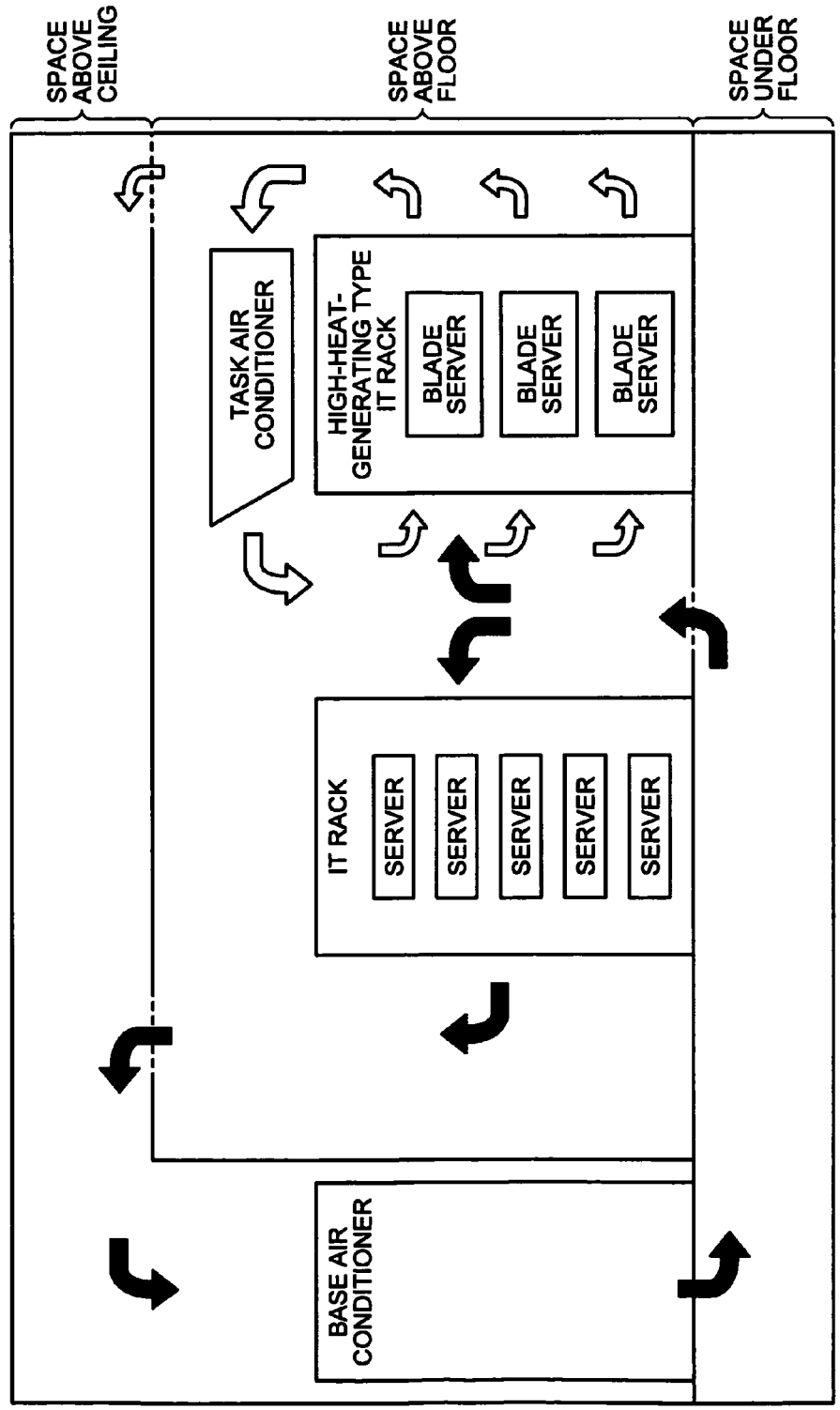

AIR CONDITIONING SYSTEM

CROSS-REFERENCE TO RELATED APPLICATION

This application is based upon and claims the benefit of priority of the prior Japanese Patent Application No. 2010-238729, filed on Oct. 25, 2010, the entire contents of which are incorporated herein by reference.

FIELD

The embodiments discussed herein are directed to an air conditioner and an air conditioning system.

BACKGROUND

In data centers, information technology (IT) racks have been installed in which information processors such as servers are mounted. The information processors mounted in the IT racks consume electric power and generate heat corresponding to the consumed electric power. Such heat causes abnormal operation of the information processors if it is left without any treatment. In the data centers, thus, the information processors are cooled down by air conditioners.

In an example of the data centers, the information processors mounted in the IT racks are cooled down by sucking, from a space under the floor, cold air supplied by a base air conditioner. The information processors exhaust the air warmed by heat taken from the information processors. The base air conditioner sucks the warmed air exhausted from the information processors, cools down the sucked air, and supplies again the cooled air to the information processors through the space under the floor.

Recently, in the data centers, an increasing number of IT racks have been installed in which a plurality of blade servers having enhanced processing capability are mounted, for example. The amount of heat generated by the blade servers increases as the blade servers enhance the processing capability. Therefore, it may be difficult for the base air conditioner alone to sufficiently cool down the blade servers. A data center is disclosed in which task air conditioners are provided near the upper part or the side part of an IT rack including such blade servers and other equipment so that information processors generating large amounts of heat are cooled down.

Cooling of information processors by a task air conditioner is described with reference to FIG. 9. FIG. 9 is a schematic illustrating a structure of an air conditioning system according to related art. The task air conditioner sucks air exhausted from the IT rack and cools down the sucked air. The task air conditioner supplies again the cooled air to the IT rack and forms a region in which a locally circulating air flow is generated. In this way, the task air conditioner supplies cooled air, and cools down the information processors generating large amounts of heat, in addition to cooled air supplied by the base air conditioner. Examples of the related art are disclosed in Japanese National Publication of International Patent Application No. 2006-526205, Japanese National Publication of International Patent Application No. 2008-502082, and Japanese Laid-open Patent Publication No. 2006-114669.

In the related art, however, the information processors cannot be efficiently cooled down. Specifically, the task air conditioner is operated at a fixed air volume such that a temperature difference between suction air and exhaust air ($\Delta Tlac$) is from 10 to 15° C. When the thermal load of suction air is high, the thermal load may exceed the cooling capacity of the task air conditioner.

For example, the temperature difference between suction air and exhaust air of the IT rack ($\Delta Tit$) housing the information processors is designed to be from 7 to 15° C. However, $\Delta Tit$ of the IT rack housing information processors designed so as to achieve low noises and low power consumption may exceed 15° C. In such a case where $\Delta Tit$ is larger than $\Delta Tlac$, the thermal load sucked by the task air conditioner exceeds the cooling capacity of the task air conditioner. As a result, the task air conditioner cannot sufficiently cool down the sucked air, and causes a hot spot at which exhaust heat is locally accumulated. The hot spot results in air having a temperature higher than that of typical air being sucked in the IT rack. As a result, the information processors cannot be sufficiently cooled down.

Alternatively, the occurrence of the hot spots can be prevented by increasing the number of installed task air conditioners so as to cool down the IT track generating large amounts of heat. This method, however, lowers a load factor of the base air conditioner when the base air conditioner has a reserved cooling capacity. As a result, total air conditioning efficiency is lowered. It is difficult to say that the information processors can be efficiently cooled down.

SUMMARY

According to an aspect of an embodiment of the invention, an air conditioner includes a suction unit that sucks air exhausted from an information processor, a cooling unit that cools down the air sucked by the suction unit, an exhaust unit that exhausts the air cooled down by the cooling unit, a determination unit that acquires a cooling state of the cooling unit, and determines whether a cooling capacity of the cooling unit exceeds an upper limit value based on the acquired cooling state, and a controller that reduces a volume of air exhausted by the exhaust unit when the determination unit determines that the cooling capacity of the cooling unit exceeds the upper limit value.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 9 is a schematic illustrating a structure of an air conditioning system according to the related art.

DESCRIPTION OF EMBODIMENT(S)

Preferred embodiments of the present invention will be explained with reference to accompanying drawings. It is noted that the embodiments do not limit the present invention.

[a] First Embodiment

Structure of Air Conditioning System

Figure 1:
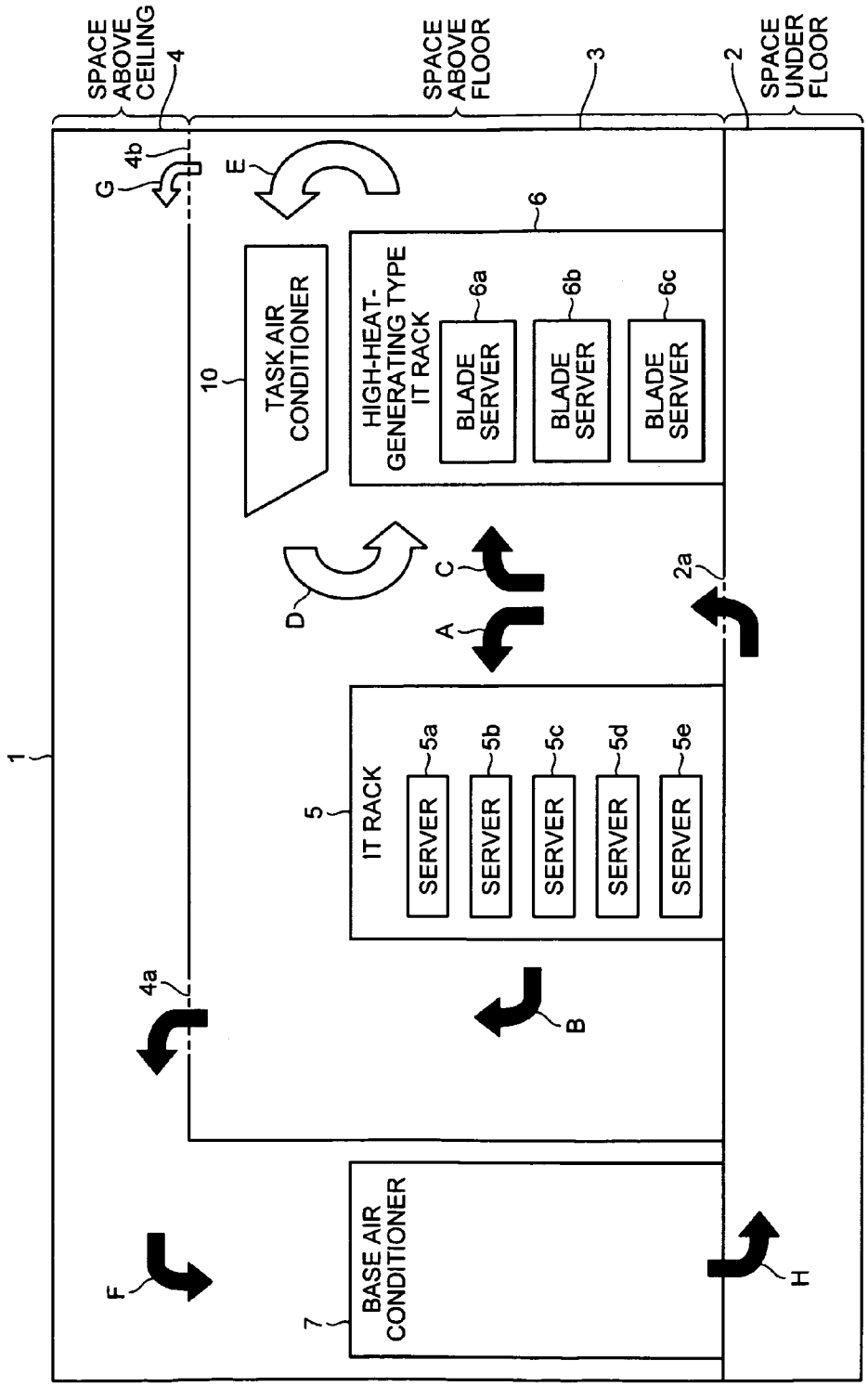
FIG. 1 is a schematic illustrating a structure of an air conditioning system according to a first embodiment.

A structure of an air conditioning system according to a first embodiment is described below with reference to FIG. 1. FIG. 1 is a schematic illustrating the structure of the air conditioning system according to the first embodiment. As illustrated in FIG. 1, an air conditioning system 1 includes a space 2 under the floor, a space 3 above the floor, and a space 4 above the ceiling.

On the floor between the space 2 under the floor and the space 3 above the floor, a floor opening 2a is disposed that is a vent communicating with the space 2 under the floor and the space 3 above the floor. On the ceiling between the space 3 above the floor and the space 4 above the ceiling, ceiling openings 4a and 4b are disposed that are vents communicating with the space 3 above the floor and the space 4 above the ceiling. In the space 3 above the floor, an information technology (IT) rack 5, a high-heat-generating type IT rack 6, a base air conditioner 7, and a task air conditioner 10 are disposed.

The IT rack 5 is a device in which a plurality of servers 5a to 5e are mounted. The server 5a sucks cold air A supplied by the base air conditioner 7 so as to cool down electronic circuits provided inside the server 5a. The server 5a exhausts air B warmed by heat taken from the server 5a. The servers 5b to 5e suck and exhaust air in the same manner as the server 5a. Thus, description thereof is omitted.

The high-heat-generating type IT rack 6 is a device in which a plurality of blade servers 6a to 6c are mounted. The blade server 6a includes a plurality of low-profile servers arranged inside a chassis with high density. The blade server 6a has higher processing performance than those of the servers 5a to 5e, and generates high heat. The blade server 6a is cooled down by both the base air conditioner 7 and the task air conditioner 10. Specifically, the blade server 6a sucks cool air C supplied by the base air conditioner 7, and cool air D from a region in which locally circulating air flow is generated formed by the task air conditioner 10 so as to cool down electronic circuits provided in the blade server 6a. The blade server 6a exhausts air E warmed by heat taken from the blade server 6a. The blade servers 6b to 6c suck and exhaust air in the same manner as the blade server 6a. Thus, description thereof is omitted.

The base air conditioner 7 sucks air F and air G blowing in the space 4 above the ceiling, cools down the sucked air, and supplies cooled air H into the space 2 under the floor. For example, the base air conditioner 7 is normally operated with a thermal load that is equal to or smaller than an upper limit value of the cooling capacity of the base air conditioner 7. The base air conditioner 7 cools down sucked air until the thermal load reaches the upper limit value of the cooling capacity in response to an increase in the thermal load. Air H supplied by the base air conditioner 7 blows into the space 3 above the floor through the floor opening 2a, and further into the IT rack 5 and the high-heat-generating type IT rack 6. Air exhausted from the IT rack 5 and the high-heat-generating type IT rack 6 is sucked into the base air conditioner 7 through the ceiling openings 4a and 4b so as to be cooled down. In this way, the base air conditioner 7 cools down the servers 5a to 5e mounted in the IT rack 5 and the blade servers 6a to 6c mounted in the high-heat-generating type IT rack 6. The base air conditioner 7 is an example of a second air conditioner provided to a plurality of IT racks as a common air conditioner in claim 7.

The task air conditioner 10 sucks the air E exhausted from the high-heat-generating type IT rack 6, and cools down the sucked air. The task air conditioner 10 supplies the cooled air D to the high-heat-generating type IT rack 6, and forms the region in which locally circulating air flow is generated. The locally circulating air flow in the region formed by the task air conditioner 10 cools down the blade servers 6a to 6c.

In the air conditioning system 1 thus structured, the task air conditioner 10 sucks air exhausted from the blade servers 6a to 6c, cools down the sucked air, and exhausts the cooled air. The task air conditioner 10 acquires a cooling state, and determines whether the cooling capacity exceeds the upper limit value based on the acquired cooling state. The case where the cooling capacity exceeds the upper limit value means a case where an amount of heat taken from air sucked by the task air conditioner 10 exceeds the cooling capacity. In other words, the thermal load exceeds the cooling capacity. When determining that the thermal load exceeds the cooling capacity, the task air conditioner 10 reduces the volume of the exhaust air D so as to suppress the occurrence of the hot spots, thereby efficiently cooling down the information processors such as servers and blade servers.

Specifically, when the volume of air exhausted by the task air conditioner 10 is reduced, the temperature of the air F sucked by the base air conditioner 7 increases. The base air conditioner 7, which has a reserved cooling capacity, cools down the sucked air F by using the reserved cooling capacity. That is, the thermal load of the base air conditioner 7 increases. The base air conditioner 7 exhausts the cooled air H so as to supply it to the IT rack 5 and the high-heat-generating type IT rack 6 through the floor opening 2a.

The blade servers 6a to 6c mounted in the high-heat-generating type IT rack 6 suck the air C supplied by the base air conditioner 7, and the air D supplied by the task air conditioner 10. The temperatures of the air C and the air D sucked by the blade servers 6a to 6c are lowered compared to when it is determined that the thermal load exceeds the cooling capacity because the volume of the air D has been reduced. Accordingly, the temperature of the air E exhausted by the blade servers 6a to 6c is also lowered. As a result, the air E sucked by the task air conditioner 10 is also lowered. In this way, the task air conditioner 10 can reduce the thermal load. The reduction of the thermal load allows the task air conditioner 10 to lower the temperature of exhaust air, and to suppress the occurrence of the hot spots.

As described above, when the thermal load exceeds the cooling capacity in the task air conditioner 10, i.e., the thermal load exceeds a certain threshold, the air conditioning system 1 allows the task air conditioner 10 to reduce the volume of the exhaust air D so as to lower the temperature of air exhausted by the task air conditioner 10. As a result, the task air conditioner 10 can suppress the occurrence of the hot spots, and efficiently cool down the information processors such as the servers and blade servers.

Structure of Task Air Conditioner According to the First Embodiment

Figure 2:
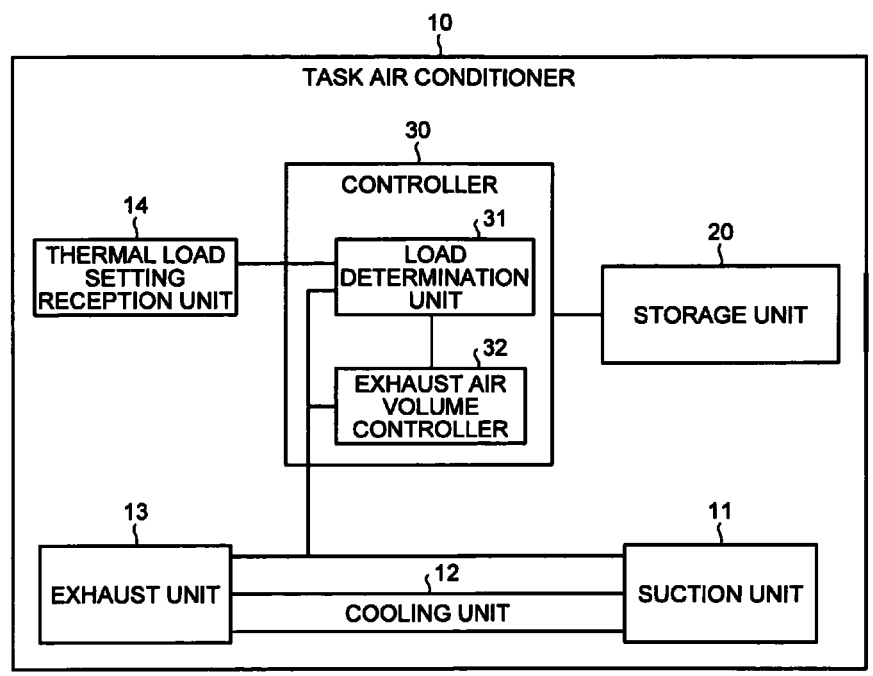
FIG. 2 is a block diagram illustrating a structure of a task air conditioner according to the first embodiment.

A structure of the task air conditioner according to the first embodiment is described with reference to FIG. 2. FIG. 2 is a block diagram illustrating the structure of the task air conditioner 10 according to the first embodiment. The task air conditioner 10 according to the first embodiment includes a suction unit 11, a cooling unit 12, an exhaust unit 13, a thermal load setting reception unit 14, a storage unit 20, and a controller 30.

The suction unit 11 sucks air with a predetermined pressure, and supplies the sucked air to the cooling unit 12. The cooling unit 12 cools down the air supplied from the suction unit 11, and supplies the cooled air to the exhaust unit 13. The exhaust unit 13 exhausts the air cooled down by the cooling unit 12 with a predetermined pressure. For example, the exhaust unit 13 exhausts air at 25.7 m$^3$/min. The exhaust unit 13 includes a temperature sensor and an anemometer, which are not illustrated. The temperature sensor measures the temperature of air exhausted by the exhaust unit 13. The anemometer measures the volume of air exhausted by the exhaust unit 13 per unit time. Likewise, the suction unit 11 includes a temperature sensor, which measures the temperature of air sucked by the suction unit 11.

The thermal load setting reception unit 14 receives the start and end of the operation of the task air conditioner 10. For example, when receiving the start of the operation from a user, the thermal load setting reception unit 14 notifies the controller 30 of the reception, so that the controller 30 allows the task air conditioner 10 to start the operation. Likewise, for example, when receiving the end of the operation from a user, the thermal load setting reception unit 14 notifies the controller 30 of the reception, so that the controller 30 allows the task air conditioner 10 to end the operation.

The thermal load setting reception unit 14 receives a setting of a value determining whether the thermal load exceeds the cooling capacity of the task air conditioner 10. For example, the thermal load setting reception unit 14 receives a setting of a given threshold determining a thermal load from a user as the value determining whether the thermal load exceeds the cooling capacity of the task air conditioner 10. In this case, the thermal load setting reception unit 14 notifies the controller 30 of the fact that the setting of the given threshold has been received, so that the controller 30 allows the storage unit 20 to store the received value therein. The thermal load setting reception unit 14 also notifies a load determination unit 31 of the fact that the setting of the given threshold determining a thermal load has been received. The thermal load setting reception unit 14 receives a maximum of the cooling capacity (kW) as the threshold determining the thermal load of the task air conditioner 10.

The storage unit 20 is a storage device such as a semiconductor memory element, and a hard disk drive. The storage unit 20 stores therein the maximum of the cooling capacity (kW) as the given threshold determining the thermal load of the task air conditioner 10. For example, the storage unit 20 stores therein "7.5 kW" as the threshold. The threshold can be changed to any value by a user. For example, the storage unit 20 may set a value of 80% of the maximum cooling capacity as the threshold.

The storage unit 20 stores therein information relating to the volume of air exhausted in the air conditioning system 1. For example, the storage unit 20 stores therein the thermal load (kW) and the maximum cooling capacity (kW) of the base air conditioner 7. Specifically, the storage unit 20 stores therein that the thermal load is "12.5 kW", and the maximum cooling capacity is "15 kW" as the information of the base air conditioner 7.

The controller 30 includes an internal memory that stores therein a control program, programs specifying various processing procedures, and necessary data. The controller 30 includes the load determination unit 31 and an exhaust air volume controller 32. For example, the controller 30 is an integrated circuit such as an application specific integrated circuit (ASIC), and a field programmable gate array (FPGA), or an electronic circuit such as a central processing unit (CPU), and a micro processing unit (MPU).

The load determination unit 31 acquires a cooling state of the cooling unit 12, and determines whether the thermal load exceeds the cooling capacity of the cooling unit 12 based on the acquired cooling state. For example, the load determination unit 31 calculates, as the cooling state, the thermal load by using the volume of air exhausted by the exhaust unit 13 and a difference between the temperature of air exhausted by the exhaust unit 13 and the temperature of air sucked by the suction unit 11. The load determination unit 31 determines that the thermal load exceeds the cooling capacity of the cooling unit 12 when the calculated thermal load exceeds a given threshold. The calculation of the thermal load performed by the load determination unit 31 (1), and the determination whether the thermal load calculated by the load determination unit 31 exceeds a given threshold (2), are described below in this order.

(1) Calculation of Thermal Load by the Load Determination Unit 31

For example, the load determination unit 31 calculates a thermal load (Plac (W)) by using the following formula (1) when the thermal load setting reception unit 14 notifies the load determination unit 31 of the fact that the setting of a given threshold determining the thermal load has been received.

$$Plac = \rho \cdot Cp \cdot Qlac \cdot (Tlac\_in - Tlac\_out) \qquad (1)$$

where Qlac (m$^3$/s) is the volume of air exhausted by the task air conditioner 10, Tlac_out (° C.) is the temperature of air exhausted by the task air conditioner 10, Tlac_in (° C.) is the temperature of air sucked by the task air conditioner 10, $\rho$ (kg/m$^3$) is the density of air, and Cp (J/kg·° C.) is the constant pressure specific heat of air.

In formula (1), $\rho$ and Cp are constants. Thus, the task air conditioner 10 can calculate a thermal load by measuring Qlac, Tlac_out, and Tlac_in. That is, the task air conditioner 10 calculates a thermal load by measuring the volume of exhaust air, the temperature of exhaust air, and the temperature of suction air.

More specifically, the load determination unit 31 measures Tlac_in with the temperature sensor included in the suction unit 11, and Tlac_out with the temperature sensor included in the exhaust unit 13. The load determination unit 31 measures the volume of exhaust air with the anemometer included in the exhaust unit 13. The load determination unit 31 calculates a thermal load by using formula (1) based on the measured values.

(2) The determination whether the thermal load calculated by the load determination unit 31 exceeds a given threshold.

Subsequently, the load determination unit 31 determines whether the calculated thermal load exceeds a given threshold. For example, the load determination unit 31 reads a given threshold stored in the storage unit 20, and compares the given threshold with the calculated thermal load. The load determination unit 31 determines that the thermal load exceeds the cooling capacity when the calculated thermal load is larger than the given threshold, and notifies the exhaust air volume controller 32 of the result. On the other hand, the load determination unit 31 determines that the thermal load does not exceed the cooling capacity when the calculated thermal load is smaller than the given threshold, and continues calculation of the thermal load.

Furthermore, the load determination unit 31 determines whether a predetermined period of time elapses, when the exhaust air volume controller 32 has reduced the volume of exhaust air. When determining that the predetermined period of time elapses, the load determination unit 31 performs processing determining whether the thermal load exceeds the given threshold. On the other hand, when determining that the predetermined period of time does not elapse, the load determination unit 31 waits until the predetermined period of time elapses.

The exhaust air volume controller 32 reduces the volume of air exhausted by the exhaust unit 13 when the load determination unit 31 determines that the thermal load exceeds the cooling capacity of the cooling unit 12. For example, the exhaust air volume controller 32 reduces the air volume by a volume corresponding to the reserved cooling capacity (also referred to as an excess thermal load) of the base air conditioner 7. Specifically, when the base air conditioner 7 has an excess thermal load of 2.5 kW, the exhaust air volume controller 32 reduces the exhaust air volume by a volume corresponding to 2.5 kW.

Figure 3:
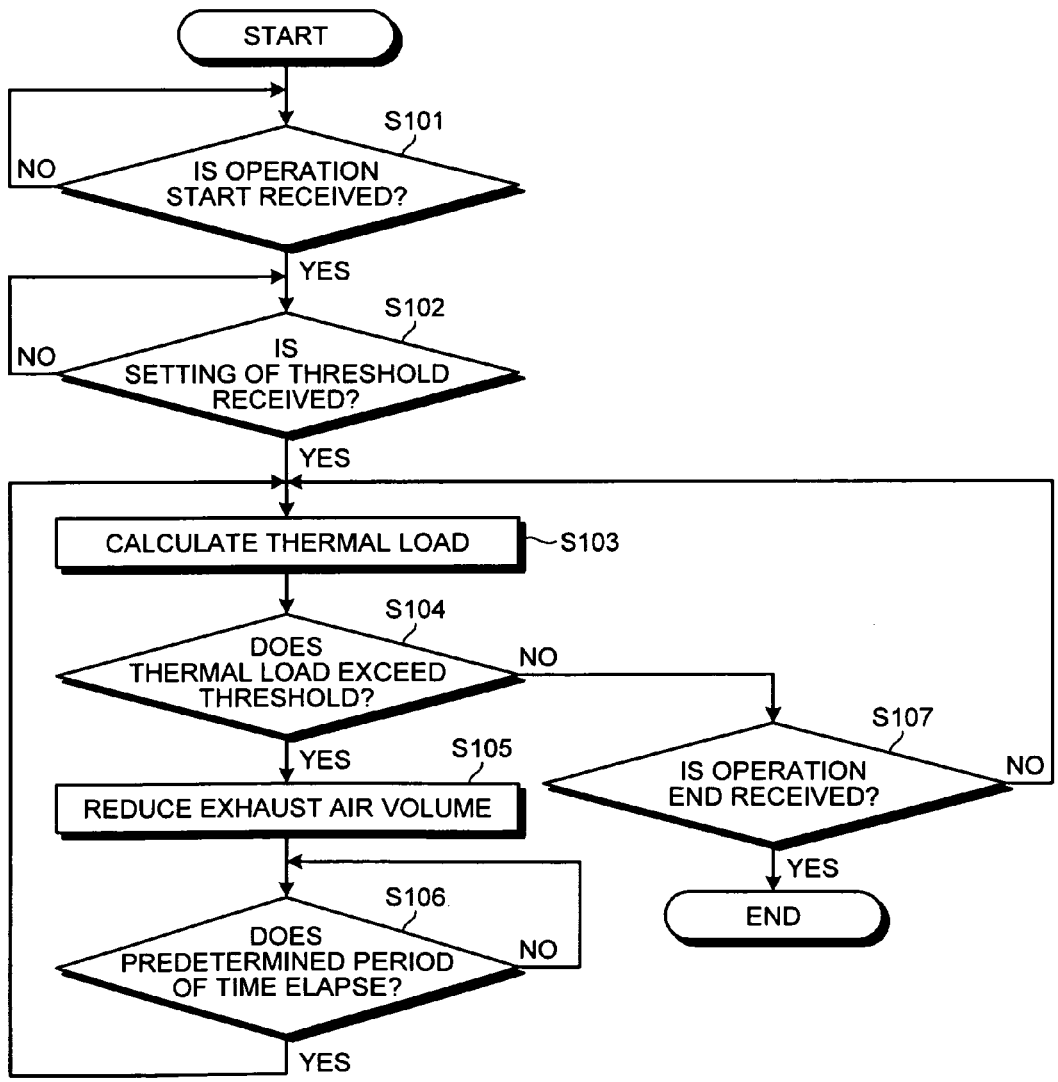
FIG. 3 is a flowchart illustrating a procedure of processing performed by the task air conditioner according to the first embodiment.

Procedure of Processing Performed by the Air Conditioner According to the First Embodiment The procedure of processing performed by the task air conditioner according to the first embodiment is described with reference to FIG. 3. FIG. 3 is a flowchart illustrating the procedure of processing performed by the task air conditioner 10 according to the first embodiment.

If receiving the operation start (YES at step S101), the thermal load setting reception unit 14 determines whether a setting of a threshold determining a thermal load is received (step S102). If the thermal load setting reception unit 14 determines that the setting of the threshold determining the thermal load is received (YES at step S102), the load determination unit 31 calculates a thermal load (step S103). Specifically, the load determination unit 31 measures the temperatures of suction air and exhaust air, and the volume of exhaust air, and calculates a thermal load by using formula (1). On the other hand, if the thermal load setting reception unit 14 determines that the setting of the threshold determining the thermal load is not received (NO at step S102), the thermal load setting reception unit 14 waits until it receives the setting of the threshold determining the thermal load.

Subsequently, the load determination unit 31 determines whether the calculated thermal load exceeds the given threshold (step S104). The load determination unit 31 constantly calculates the thermal load after the setting of the threshold determining the thermal load is received. If the load determination unit 31 determined that the thermal load exceeds the given threshold (YES at step S104), the exhaust air volume controller 32 reduces the volume of exhaust air to a certain volume (step S105).

Then, the load determination unit 31 determines whether a predetermined period of time elapses (step S106). If determining that the predetermined period of time elapses (YES at step S106), the load determination unit 31 returns to step S103 to calculate the thermal load. On the other hand, if determining that the predetermined period of time does not elapse (NO at step S106), the load determination unit 31 waits until the predetermined period of time elapses.

If determining that the thermal load does not exceed the given threshold (NO at step S104), the load determination unit 31 determines whether the operation end is received (step S107). If determining that the operation end is received (YES at step S107), the load determination unit 31 ends the processing. On the other hand, if determining that the operation end is not received (NO at step S107), the load determination unit 31 moves to step S103 to continue processing after step S103.

Effects of the First Embodiment

As described above, in the air conditioning system 1 of the first embodiment, the task air conditioner 10 reduces the exhaust air volume based on the reserved cooling capacity of the base air conditioner 7 when the thermal load exceeds the cooling capacity of the task air conditioner 10. As a result, the task air conditioner 10 can reduce the thermal load of the task air conditioner 10.

The base air conditioner 7 makes up for the thermal load reduced by the task air conditioner 10. That is, the cooling capacity of the air conditioning system 1 remains unchanged even though the task air conditioner 10 reduces the thermal load. As a result, the task air conditioner 10 can reduce the thermal load without lowering the air conditioning efficiency of the air conditioning system.

[b] Second Embodiment

In the first embodiment, the base air conditioner 7 can process the thermal load until the thermal load reaches the upper limit value of the cooling capacity, i.e., the thermal load of the base air conditioner 7 is not limited to a certain value. The cooling capacity of the base air conditioner, however, may be limited so as not exceed an upper limit value, for energy saving. In other words, the exhaust air volume of the base air conditioner may be limited so that the base air conditioner does not have an excess thermal load. In a second embodiment, a case is described in which the thermal load of the task air conditioner exceeds a given threshold when the exhaust air volume of the base air conditioner is limited so that the base air conditioner does not have an excess thermal load.

Structure of an Air Conditioning System According to the Second Embodiment

Figure 4:
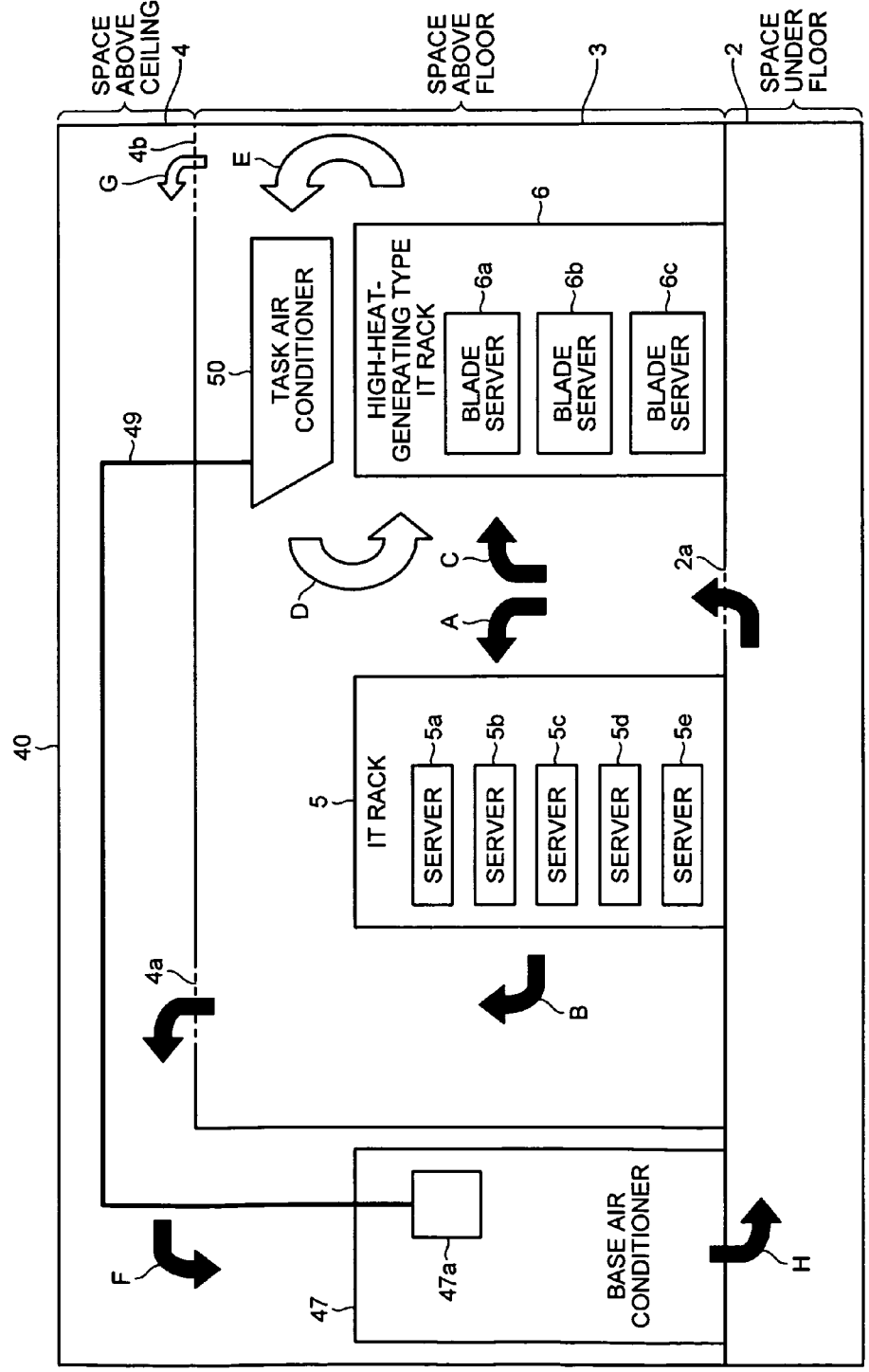
FIG. 4 is a schematic illustrating a structure of an air conditioning system according to a second embodiment.

The structure of an air conditioning system according to the second embodiment is described with reference to FIG. 4. FIG. 4 is a schematic illustrating the structure of an air conditioning system 40 according to the second embodiment. As illustrated in FIG. 4, the air conditioning system 40 includes the space 2 under the floor, the space 3 above the floor, and the space 4 above the ceiling. The functional elements playing the same roles as the elements of FIG. 1 are labeled with the same numerals, and detailed description thereof is omitted.

In the space 3 above the floor, the IT rack 5, the high-heat-generating type IT rack 6, a base air conditioner 47, and a task air conditioner 50 are disposed. The base air conditioner 47 and the task air conditioner 50 are coupled with each other through a network 49 such that they can communicate with each other. The network 49 is, for example, a local area network (LAN).

The base air conditioner 47 includes an exhaust air volume controller 47a in addition to the functions of the base air conditioner 7 according to the first embodiment. When receiving a notification from the task air conditioner 50, the exhaust air volume controller 47a cancels the limitation of the thermal load, and increases the air volume to be exhausted. The base air conditioner 47 is an example of the second air conditioner provided to a plurality of IT racks as a common air conditioner in claim 7.

The task air conditioner 50 has a function notifying the base air conditioner 47 of information relating to a reduced exhaust air volume, in addition to the functions of the task air conditioner 10 according to the first embodiment. The functions of the task air conditioner 50 are described in the structure of the task air conditioner, which is described later.

In the air conditioning system 40 thus structured, the task air conditioner 50 sucks air exhausted from the blade servers 6a to 6c, cools down the sucked air, and exhausts the cooled air. The task air conditioner 50 acquires a cooling state, and determines whether the thermal load exceeds the cooling capacity based on the acquired cooling state. When determining that the thermal load exceeds the cooling capacity, the task air conditioner 50 reduces the volume of the exhaust air D. The task air conditioner 50 notifies the exhaust air volume controller 47a of the fact that the task air conditioner 50 has reduced the volume of exhaust air D, and allows the exhaust air volume controller 47a to cancel the limitation of the thermal load. In this way, the task air conditioner 50 suppresses the occurrence of the hot spots, and can efficiently cool down the information processors such as the servers and blade servers.

Specifically, the reduction of the volume of the air D exhausted by the task air conditioner 50 causes a shortage of the air volume in the air conditioning system 40, resulting in the occurrence of the hot spots at another place. Upon receiving, from the task air conditioner 50, the notification that the exhaust air volume has been reduced to a certain volume, the base air conditioner 47 increases the exhaust air volume until the thermal load reaches the upper limit value of the cooling capacity based on the reduced air volume. In other words, the base air conditioner 47 exhausts the air volume corresponding to the excess thermal load. The base air conditioner 47 exhausts cooled air H so as to supply it to the IT rack 5 and the high-heat-generating type IT rack 6 through the floor opening 2a.

The blade servers 6a to 6c mounted in the high-heat-generating type IT rack 6 sucks the air C supplied by the base air conditioner 47, and the air D supplied by the task air conditioner 50. The temperatures of the air C and the air D sucked by the blade servers 6a to 6c are lowered compared to when it is determined that the thermal load exceeds the cooling capacity because the volume of the air D has been reduced. As a result, the temperature of the air E exhausted by the blade servers 6a to 6c is also lowered. As a result, the air E sucked by the task air conditioner 50 is also lowered. In this way, the task air conditioner 50 can reduce the thermal load. The reduction of the thermal load allows the task air conditioner 50 to lower also the temperature of exhaust air D, and to suppress the occurrence of the hot spots.

As described above, when the thermal load of the task air conditioner 50 exceeds the given threshold, the air conditioning system 40 allows the task air conditioner 50 to reduce the volume of the exhaust air D so as to lower the temperature of air exhausted by the task air conditioner 50. As a result, the task air conditioner 50 can suppress the occurrence of the hot spots, and efficiently cool down the information processors such as the servers and blade servers.

Structure of Task Air Conditioner

Figure 5:
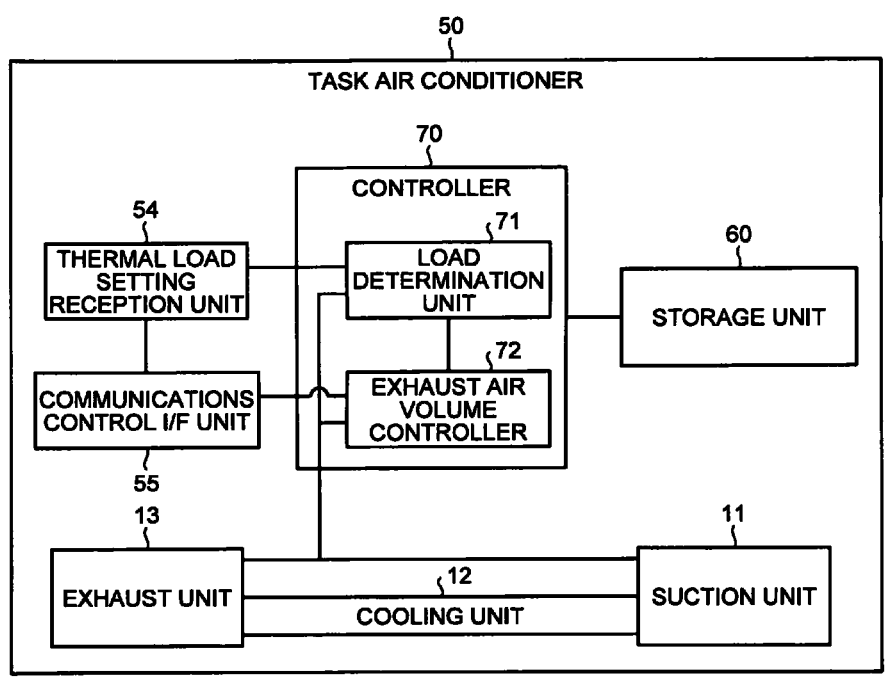
FIG. 5 is a block diagram illustrating a structure of a task air conditioner according to the second embodiment.

A structure of the task air conditioner according to the second embodiment is described with reference to FIG. 5. FIG. 5 is a block diagram illustrating the structure of the task air conditioner 50 according to the second embodiment. The task air conditioner 50 according to the second embodiment includes the suction unit 11, the cooling unit 12, the exhaust unit 13, a thermal load setting reception unit 54, a communications control interface (I/F) unit 55, a storage unit 60, and a controller 70. The functional elements playing the same roles as the elements of FIG. 2 are labeled with the same numerals, and detailed description thereof is omitted.

The thermal load setting reception unit 54 has the following functions in addition to the functions of the thermal load setting reception unit 14 described in the first embodiment. The thermal load setting reception unit 54 receives, from a user, a setting of a temperature threshold determining whether the thermal load exceeds the cooling capacity of the task air conditioner 50. Upon receiving the setting of the temperature threshold from the user, the thermal load setting reception unit 54 notifies the controller 70 of the fact that the setting of the temperature threshold has been received, and allows the controller 70 to store the received value in the storage unit 60. The thermal load setting reception unit 54 notifies a load determination unit 71 of the fact that the setting of the temperature threshold has been received.

The communications control I/F unit 55 is an interface that includes at least one communications port, and controls information exchanged between the task air conditioner 50 and the base air conditioner 47. For example, the communications control I/F unit 55 receives, from an exhaust air volume controller 72, the notification that the exhaust air volume has been reduced, and transmits the notification to the base air conditioner 47 coupled with the task air conditioner 50 through the network 49.

The storage unit 60 is a storage device such as a semi-conductor memory element and a hard disk drive. The storage unit 60 stores therein the temperature threshold that is a setting value set as the upper limit value of the temperature of air exhausted by the exhaust unit 13. For example, the storage unit 60 stores therein "33° C." as the temperature threshold. The temperature threshold can be changed to any value by a user.

The storage unit 60 stores therein information relating to the volume of air exhausted in the air conditioning system 40. For example, the storage unit 60 stores therein the thermal load (kW), the maximum cooling capacity (kW), and the exhaust air volume (m$^3$/min) of the base air conditioner 47.

Specifically, the storage unit 60 stores therein that the thermal load is "12.5 kW", the maximum cooling capacity is "15 kW", and the exhaust air volume is "29.9 m$^3$/min" as the information of the base air conditioner 47.

The controller 70 includes an internal memory that stores therein a control program, programs specifying various processing procedures, and necessary data. The controller 70 includes the load determination unit 71 and the exhaust air volume controller 72. For example, the controller 70 is an integrated circuit such as an ASIC and an FPGA, or an electronic circuit such as a CPU and an MPU.

The load determination unit 71 acquires a cooling state of the cooling unit 12, and determines whether the thermal load exceeds the cooling capacity of the cooling unit 12 based on the acquired cooling state. For example, in the first embodiment, the load determination unit 31 calculates a thermal load as the cooling state, and determines whether the calculated value exceeds a given threshold. When the thermal load of the task air conditioner exceeds the given threshold, the temperature of air sucked by the task air conditioner increases up to the temperature exceeding the cooling capacity. As a result, the task air conditioner exhausts air having a higher temperature than a set temperature because the task air conditioner cannot cool down air to the set temperature. Therefore, the task air conditioner can determine whether the cooling state exceeds the upper limit value by determining whether the temperature of exhaust air is higher than the set temperature, without calculating the thermal load.

More specifically, the load determination unit 71 measures the temperature of air exhausted by the exhaust unit 13 as the cooling state, and determines that the thermal load exceeds the cooling capacity of the cooling unit 12 when the measured temperature exceeds the set temperature. For example, when receiving the notification from the thermal load setting reception unit 54, the load determination unit 71 constantly measures the temperature of air exhausted by the exhaust unit 13 with the temperature sensor included in the exhaust unit 13, and determines whether the temperature of the exhaust air exceeds a temperature threshold stored in the storage unit 60.

Specifically, the load determination unit 71 determines that the thermal load exceeds the cooling capacity if the value of the temperature measured by the temperature sensor is larger than the temperature threshold "33° C." stored in the storage unit 60. The load determination unit 71 notifies the exhaust air volume controller 72 of the fact that the thermal load has exceeded the cooling capacity. On the other hand, if the value of the temperature measured by the temperature sensor is smaller than the temperature threshold "33° C." stored in the storage unit 60, the load determination unit 71 determines that the thermal load does not exceed the cooling capacity, and continues the determination of whether the measured temperature exceeds the set value.

The exhaust air volume controller 72 has the following functions in addition to the functions of the exhaust air volume controller 32 described in the first embodiment. When the load determination unit 71 determines that the measured temperature exceeds the set temperature threshold, the exhaust air volume controller 72 reduces the volume of air exhausted by the exhaust unit 13 to a certain volume.

For example, the exhaust air volume controller 72 reads a reserved cooling capacity of the base air conditioner 47 stored in the storage unit 60. The reserved cooling capacity is determined as a result of the limitation of the cooling capacity of the base air conditioner 47. The exhaust air volume controller 72 reduces the air volume corresponding to the read reserved cooling capacity. Specifically, when the reserved cooling capacity of the base air conditioner 47 is 2.5 kW as a result of the limitation, the exhaust air volume controller 72 reduces the exhaust air volume by a volume corresponding to 2.5 kW.

When having reduced the volume of exhaust air, the exhaust air volume controller 72 notifies the base air conditioner 47 coupled with the task air conditioner 50 through the network 49 of the fact that the volume of the exhaust air has been reduced. As a result, the base air conditioner 47 cancels the limitation so that the base air conditioner 47 does not have the reserved cooling capacity, and can process the thermal load until the thermal load reaches the upper limit value of the cooling capacity.

Figure 6:
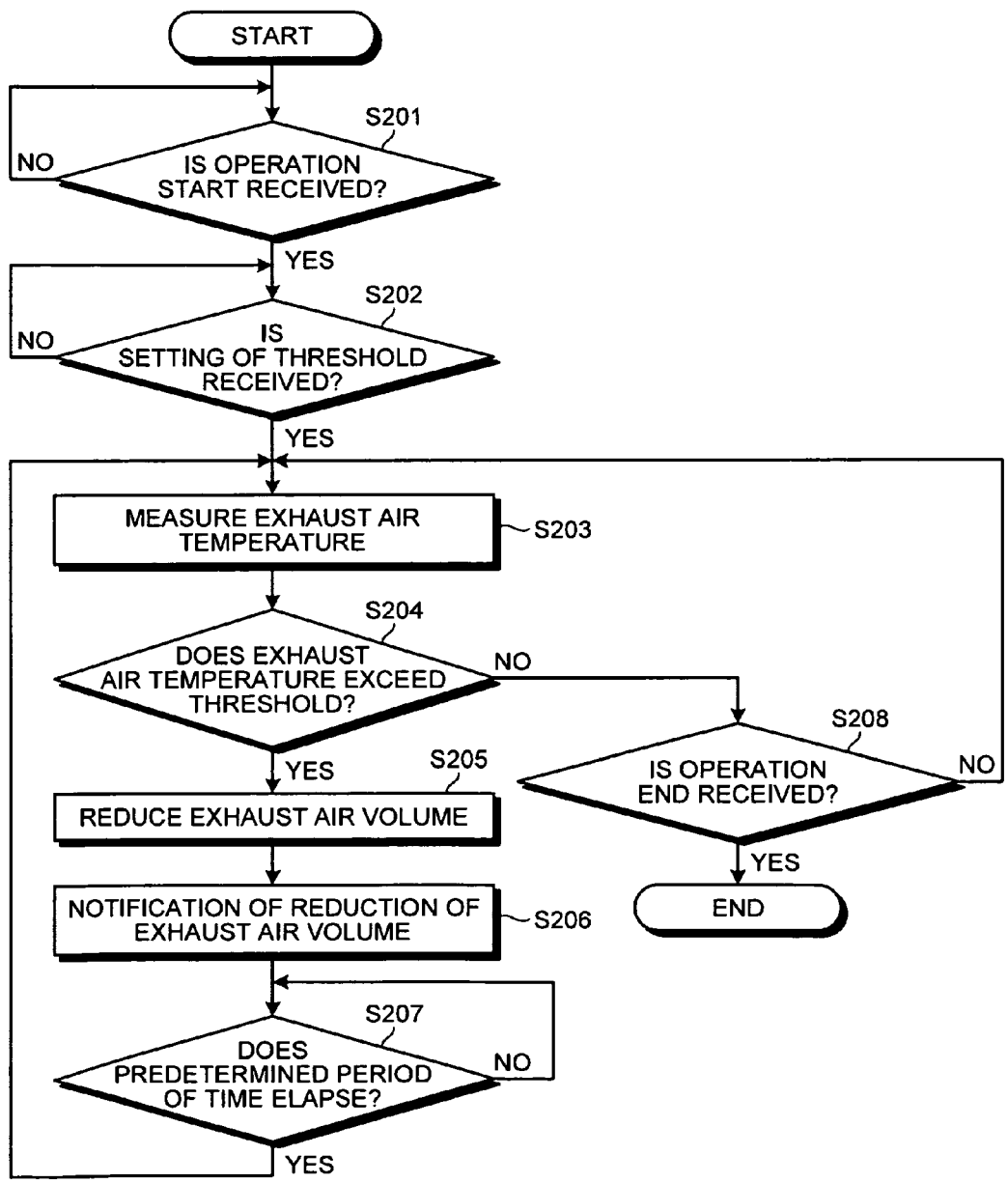
FIG. 6 is a flowchart illustrating a procedure of processing performed by the task air conditioner according to the second embodiment.

Procedure of Processing Performed by the Task Air Conditioner According to the Second Embodiment A procedure of processing performed by the task air conditioner 50 according to the second embodiment is described with reference to FIG. 6. FIG. 6 is a flowchart illustrating the procedure of the processing performed by the task air conditioner 50 according to the second embodiment.

If the operation start is received (YES at step S201), the thermal load setting reception unit 54 determines whether a setting of a temperature threshold is received (step S202). That is, the thermal load setting reception unit 54 determines whether the temperature threshold is received. If the thermal load setting reception unit 54 determines that the setting of the temperature threshold is received (YES at step S202), the load determination unit 71 measures the temperature of exhaust air (step S203). The load determination unit 71 may measure the temperatures of suction air and exhaust air, and the volume of exhaust air, and calculate a thermal load by using formula (1), in the same manner as the first embodiment.

On the other hand, if determining that the setting of the temperature threshold is not received (NO at step S202), the thermal load setting reception unit 54 waits until the thermal load setting reception unit 54 receives the setting of the temperature threshold.

Subsequently, the load determination unit 71 determines whether the measured exhaust air temperature exceeds the given threshold (step S204). After receiving the setting of the temperature threshold, the load determination unit 71 constantly measures the temperature of exhaust air. If the load determination unit 71 determines that the measured exhaust air temperature exceeds the threshold (YES at step S204), the exhaust air volume controller 72 reduces the volume of exhaust air (step S205). The exhaust air volume controller 72 notifies the base air conditioner 47 coupled with the task air conditioner 50 through the network 49 of the fact that the exhaust air volume has been reduced (step S206).

Then, the load determination unit 71 determines whether a predetermined period of time elapses (step S207). If determining that the predetermined period of time elapses (YES at step S207), the load determination unit 71 returns to step S203 to measure the temperature of exhaust air. On the other hand, if determining that the predetermined period of time does not elapse (NO at step S207), the load determination unit 71 waits until the predetermined period of time elapses.

If determining that the measured exhaust air temperature does not exceed the threshold (NO at step S204), the load determination unit 71 determines whether the operation end is received (step S208). If determining that the operation end is received (YES at step S208), the load determination unit 71 ends the processing. On the other hand, if determining that the operation end is not received (NO at step S207), the load determination unit 71 moves to step S203 to continue processing after step S203.

Effects of the Second Embodiment

As described above, in the air conditioning system 40 according to the second embodiment, the task air conditioner 50 reduces the exhaust air volume so as to reduce the thermal load when the thermal load exceeds the cooling capacity. The task air conditioner 50 allows the base air conditioner 47 to cancel the limitation of the exhaust air volume so that the base air conditioner 47 does not have the excess thermal load, and to make up for the insufficient air volume in the air conditioning system 40. Consequently, the task air conditioner 50 can process the thermal load exceeding the cooling capacity.

The task air conditioner 50 can determine whether the thermal load exceeds the cooling capacity only by measuring the temperature of exhaust air and determining whether the measured temperature exceeds a predetermined set value without calculating the thermal load.

[c] Third Embodiment

In the first and the second embodiments, the base air conditioner and the task air conditioner cool down the servers mounted in the IT rack and the blade servers mounted in the high-heat-generating type IT rack. In a data center, only the task air conditioner may cool down the servers mounted in the IT rack and the blade servers mounted in the high-heat-generating type IT rack. In a third embodiment, in the data center, no base air conditioner is provided, and only the task air conditioner cools down the servers mounted in the IT rack and the blade servers mounted in the high-heat-generating type IT rack.

Structure of an Air Conditioning System According to the Third Embodiment

Figure 7:
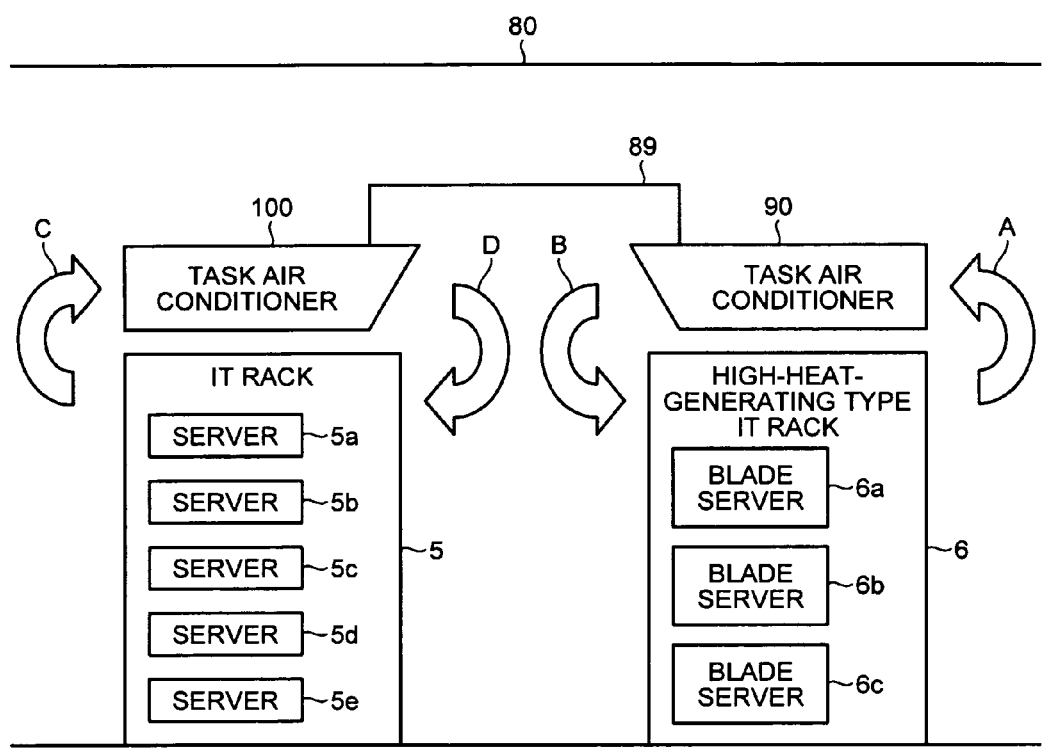
FIG. 7 is a schematic illustrating a structure of an air conditioning system according to a third embodiment.

A structure of an air conditioning system according to the third embodiment is described with reference to FIG. 7. FIG. 7 is a schematic illustrating the structure of an air conditioning system 80 according to the third embodiment. The air conditioning system 80 according to the third embodiment includes the IT rack 5, the high-heat-generating type IT rack 6, a task air conditioner 90, and a task air conditioner 100. The functional elements playing the same roles as the elements of FIG. 1 are labeled with the same numerals, and detailed description thereof is omitted.

The task air conditioner 90 sucks air A exhausted from the high-heat-generating type IT rack 6, and cools down the sucked air. The task air conditioner 90 supplies cooled air B to the high-heat-generating type IT rack 6 to form a region in which a locally circulating air flow is generated. The locally circulating air flow in the region formed by the task air conditioner 90 cools down the blade servers 6a to 6c.

The task air conditioner 100 sucks air C exhausted from the IT rack 5, and cools down the sucked air. The task air conditioner 100 supplies cooled air D to the IT rack 5 and forms a region in which a locally circulating air flow is generated. The locally circulating air flow in the region formed by the task air conditioner 100 cools down the servers 5a to 5e. The task air conditioner 100 is operated such that the cooling capacity of the task air conditioner 100 so as to have a reserved cooling capacity. The reserved cooling capacity is determined as a result of the limitation of the cooling capacity of the task air conditioner 100. When receiving a notification from the task air conditioner 90, the task air conditioner 100 cancels the limitation to have the reserved cooling capacity, and increases the exhaust air volume.

The task air conditioner 90 and the task air conditioner 100 are coupled with each other through a network 89 such that they can communicate with each other. The network 89 is, for example, a local area network (LAN). Each of the task air conditioners 90 and 100 has the same structure as the task air conditioner 50, and thus, description thereof is omitted.

In the air conditioning system 80 thus structured, the task air conditioner 90 acquires a cooling state, and determines whether the thermal load exceeds the cooling capacity based on the acquired cooling state. When determining that the thermal load exceeds the cooling capacity, the task air conditioner 90 reduces the volume of the exhaust air B to a certain volume. The task air conditioner 90 notifies the task air conditioner 100 of the fact that the volume of the exhaust air B has been reduced, and allows the task air conditioner 100 to increase the exhaust air volume until the thermal load reaches the upper limit value of the cooling capacity. In this way, the task air conditioner 90 suppresses the occurrence of the hot spots, and can efficiently cool down the information processors such as the servers and blade servers.

Specifically, the reduction of the volume of the exhaust air B by the task air conditioner 90 causes a shortage of the air volume in the air conditioning system 80, resulting in the occurrence of the hot spots at another place. Upon receiving the notification that the exhaust air volume has been reduced to a certain volume from the task air conditioner 90, the task air conditioner 100 increase the exhaust air volume until the thermal load reaches the upper limit value of the cooling capacity based on the reduced air volume. In other words, the task air conditioner 100 exhausts the air volume corresponding to the excess thermal load. The task air conditioner 100 exhausts the cooled air D so as to supply it to the IT rack 5 and the high-heat-generating type IT rack 6.

The blade servers 6a to 6c mounted in the high-heat-generating type IT rack 6 suck the air B supplied by the task air conditioner 90 and the air D supplied by the task air conditioner 100. The temperatures of the air B and the air D sucked by the blade servers 6a to 6c are lowered compared to when it is determined that the thermal load exceeds the cooling capacity because the volume of the air B has been reduced. As a result, the temperature of the air A exhausted by the blade servers 6a to 6c is also lowered. As a result, the temperature of the air A sucked by the task air conditioner 90 is also lowered. In this way, the task air conditioner 90 can reduce the thermal load. The reduction of the thermal load allows the task air conditioner 90 to lower also the temperature of exhaust air B, and to suppress the occurrence of the hot spots.

In the air conditioning system 80, the task air conditioner 90 acquires a cooling state. When determining that the thermal load exceeds the cooling capacity based on the acquired cooling state, the task air conditioner 90 reduces the volume of the exhaust air A so as to lower the temperature of the air A exhausted from the task air conditioner 90. As a result, the task air conditioner 90 can suppress the occurrence of the hot spots, and efficiently cool down the information processors such as the servers and blade servers.

Effects of the Third Embodiment

As described above, in the third embodiment, the task air conditioner reduces the exhaust air volume when the thermal load exceeds the cooling capacity, and can reduce the thermal load. The task air conditioner allows another task air conditioner to increase the thermal load, and can suppress the occurrence of the hot spots even though the task air conditioner reduces the exhaust air volume when the thermal load exceeds the cooling capacity. In this way, the task air conditioners can efficiently cool down the information processors such as the servers and the blade servers without providing a base air conditioner.

[d] Fourth Embodiment

The air conditioner of the present invention may be embodied as various embodiments in addition to the above-described embodiments. In the Fourth embodiment, other embodiments of the air conditioner of the present invention are described.

System Structure

In the processes described in the above-described embodiments, all or a part of the processes described to be automatically performed can also be manually performed. Alternatively, all or a part of the processes described to be manually performed can also be automatically performed by known methods. In addition, the processing procedures, the control procedures, and the specific names described in the above text and drawings can be arbitrarily modified unless otherwise specified.

Information stored in the storage units illustrated in the drawings is only an example. The information is not always required to be stored in the described manner. Information stored in the storage units may be stored in an internal memory included in the controller.

In the above-described embodiments, the task air conditioner reduces the exhaust air volume to a certain volume when the thermal load exceeds the cooling capacity. The way to reduce the volume, however, is not limited to those in the embodiments. For example, the task air conditioner may be designed and structured so as to reduce the exhaust air volume in a step-by-step manner. Specifically, when having a reserved cooling capacity of 2.5 kW, the task air conditioner may repeat reducing the air volume corresponding to the cooling capacity of 0.5 kW, instead of reducing the air volume corresponding to the cooling capacity of 2.5 kW at one time.

The air conditioner may be designed and structured so as to increase the exhaust air volume when the cooling capacity of the cooling unit falls to below the upper limit value after the exhaust unit has reduced the exhaust air volume to a certain volume. For example, when having reduced the air volume corresponding to the cooling capacity of 2.5 kW and thereafter the thermal load falls to a given threshold, the task air conditioner may increase the air volume by the volume corresponding to the cooling capacity of 2.5 kW. The task air conditioner may increase the air volume, at one time, or in a step-by-step manner, up to the air volume that is equal to the reduced air volume corresponding to the reserved cooling capacity.

The constituent components illustrated in the drawings are functionally conceptual, and are not always required to be physically structured as illustrated in the drawings. For example, the load determination unit 31 and the exhaust air volume controller 32 may be integrated in the task air conditioner 10. All or a part of the processing functions performed by the air conditioners may be realized by a CPU and a program analyzed and executed by the CPU, or may be realized by hardware based on wired logic.

Program

The various processing described in the above-described embodiments can be achieved by a computer system, such as a personal computer and a work station, executing a preliminarily prepared program. An example of the computer system executing a program having the same functions as the above-described embodiments is described below.

Figure 8:
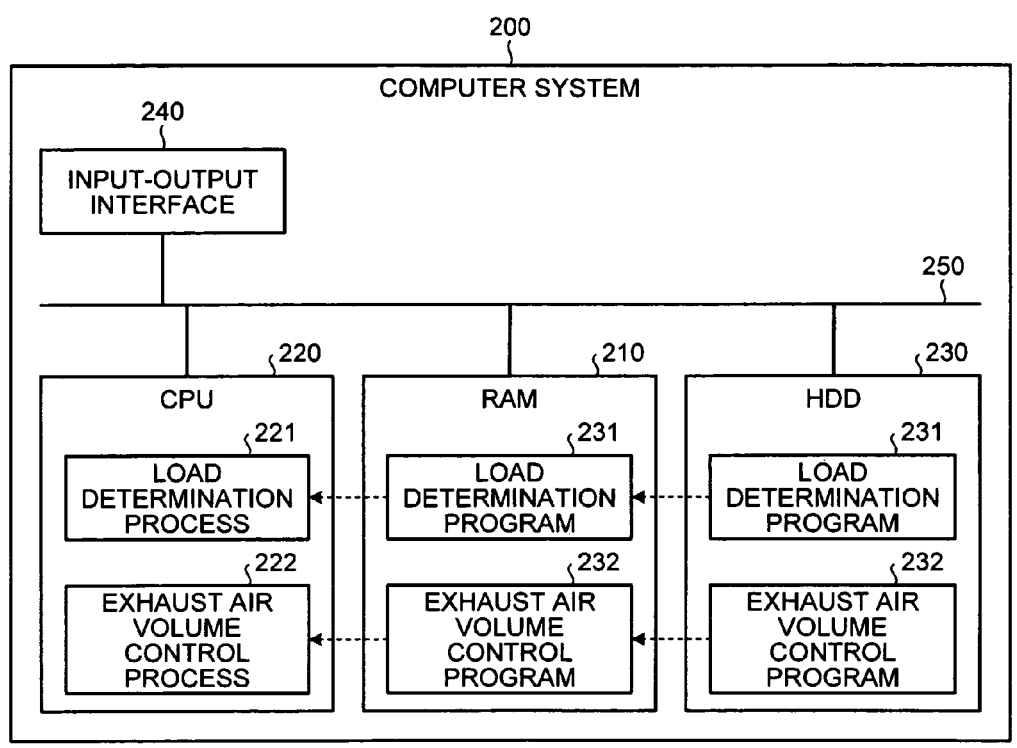
FIG. 8 is a schematic illustrating a computer system executing an air conditioning control program.

FIG. 8 is a schematic illustrating a computer system executing an air conditioning control program. As illustrated in FIG. 8, a computer system 200 includes an RAM 210, a CPU 220, an HDD 230, and an input-output interface 240. In addition, they are coupled with each other through a bus 250. The input-output interface 240 corresponds to the thermal load setting reception unit 14 illustrated in FIG. 2.

The HDD 230 preliminarily stores therein a program performing the same functions as the above-described embodiments. Specifically, as illustrated in FIG. 8, the HDD 230 preliminarily stores therein a load determination program 231 and an exhaust air volume control program 232.

The CPU 220 reads the load determination program 231 and the exhaust air volume control program 232 so as to load the programs in the RAM 210. The CPU 220 executes the load determination program 231 as a load determination process 221, and the exhaust air volume control program 232 as an exhaust air volume control process 222. The load determination process 221 corresponds to the load determination unit 31 illustrated in FIG. 2 while the exhaust air volume control process 222 corresponds to the exhaust air volume controller 32 illustrated in FIG. 2.

The load determination program 231 and the exhaust air volume control program 232 are not always required to be stored in the HDD 230. For example, they may be stored in a "portable physical medium", such as a flexible disk (FD), a compact disk (CD)-ROM, a magnet-optical (MO) disk, a digital versatile disk (DVD), a magneto optical disk, and an integrated circuit (IC) card, which is inserted into the computer system 200. They may be stored in a "fixed physical medium", such as an HDD provided as an external device of the computer system 200. They may be stored in "another computer system" coupled with the computer system 200 though public lines, the Internet, a local area network (LAN), or a wide area network (WAN), for example. The computer system 200 may read the programs from above-described media and systems, and execute them.

That is, the programs are stored in a recording medium, such as the "portable physical medium", the "fixed physical medium", and the "communications medium" such that they can be read by a computer. The computer system 200 reads the programs from the recording medium, executes them, and realizes the same functions as the above-described embodiments. The programs described in the embodiment are not limited to be executed by the computer system 200. For example, the present invention can be applied to a case, such as when the programs are executed by another computer system or server, and the programs are executed by cooperation of the computer system and the server.

The air conditioner and the air conditioning system can efficiently cool down information processors.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An air conditioning system, comprising:
    at least one first air conditioner provided in a first space and configured to
        suck air exhausted from a high-heat-generation type information technology (IT) rack which generates higher heat than heat generated by other IT racks, the high-heat generation type IT rack and other IT racks respectively arranged in the first space and housing at least one information processor,
        cool down the sucked air, and
        exhaust the cooled air to the high-heat-generation type IT rack; and
    a second air conditioner provided in a second space, the second space being divided from and communicated with the first space via a first opening allowing continuous air ventilation and a second opening allowing continuous air ventilation, and configured to cool down the at least one information processor housed in the high-heat generation type IT rack and the other IT racks arranged in the first space by cooling down air exhausted from the first space via the first opening and exhausting the cooled air back to the first space via the second opening while operating at a reserved cooling capacity,
    wherein the first air conditioner includes:
        a suction unit that sucks air exhausted from an information processor housed in the high-heat-generation type IT rack;

a cooling unit that cools down the air sucked by the suction unit;

an exhaust unit that exhausts the air cooled down by the cooling unit; and at least one controller that acquires a cooling state of the cooling unit, determines, based on the acquired cooling state, whether a thermal load of the cooling unit exceeds a cooling capacity of the cooling unit, and reduces a volume of air exhausted by the exhaust unit by a volume corresponding to the reserved cooling capacity of the second air conditioner in response to the thermal load of the cooling unit exceeding the cooling capacity of the cooling unit, and wherein the second air conditioner cools down the sucked air by the first air conditioner using the reserved cooling capacity of the second air conditioner when the at least one controller of the first air conditioner reduces the volume of the air exhausted by the exhaust unit of the first air conditioner.

2. The air conditioning system according to claim 1, wherein the at least one controller calculates the thermal load as the cooling state according to the volume of air exhausted by the exhaust unit, and a difference between a temperature of air exhausted by the exhaust unit and a temperature of air sucked by the suction unit, and determines that the calculated thermal load exceeds the cooling capacity of the cooling unit when the calculated thermal load is larger than a given threshold.

3. The air conditioning system according to claim 1, wherein the at least one controller measures a temperature of air exhausted by the exhaust unit as the cooling state, and determines that the thermal load exceeds the cooling capacity of the cooling unit when the measured temperature exceeds a set value.

4. The air conditioning system according to claim 1, wherein the at least one controller of the first air conditioner increases the volume of air exhausted by the exhaust unit of the first air conditioner by a certain volume when the thermal load of the cooling unit does not exceed a cooling capacity of the cooling unit after reducing the volume of air exhausted by the exhaust unit of the first air conditioner to a volume corresponding to a reserved cooling capacity of the first air conditioner.

5. The air conditioning system according to claim 1, wherein the at least one controller of the first air conditioner notifies the second air conditioner of a reduced air volume when reducing the volume of air exhausted by the exhaust unit of the first air conditioner.

6. The air conditioning system according to claim 5, wherein when the second air conditioner receives the notification of the reduced air volume from the first air conditioner, an exhaust air volume controller of the second air conditioner increases the volume of air exhausted by the second air conditioner based on the reduced air volume.

* * * * *